(12) United States Patent
Lee et al.

(10) Patent No.: US 9,530,339 B2
(45) Date of Patent: Dec. 27, 2016

(54) APPARATUS AND METHOD FOR INSPECTING AN ORGANIC LIGHT-EMITTING DISPLAY APPARATUS

(71) Applicant: SAMSUNG DISPLAY CO., LTD., Yongin, Gyeonggi-Do (KR)

(72) Inventors: June-Woo Lee, Yongin (KR); Kwan-Wook Jung, Yongin (KR); Guang-Hai Jin, Yongin (KR); Jae-Beom Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 223 days.

(21) Appl. No.: 14/261,260

(22) Filed: Apr. 24, 2014

(65) Prior Publication Data

US 2015/0048835 A1 Feb. 19, 2015

(30) Foreign Application Priority Data

Aug. 16, 2013 (KR) .................. 10-2013-0097315

(51) Int. Cl.
*G09G 3/06* (2006.01)
*G09G 3/00* (2006.01)
*G09G 3/32* (2016.01)
*G01R 31/02* (2006.01)

(52) U.S. Cl.
CPC ............. *G09G 3/006* (2013.01); *G01R 31/024* (2013.01); *G09G 3/3208* (2013.01); *G01R 31/023* (2013.01); *G09G 2330/12* (2013.01)

(58) Field of Classification Search
CPC ... G01R 31/44; G01R 31/2635; G01R 31/024; G09G 3/006; H05B 3/0893

USPC ........................................................ 324/414

See application file for complete search history.

(56) References Cited

U.S. PATENT DOCUMENTS

| | | | | |
|---|---|---|---|---|
| 4,271,408 A | * | 6/1981 | Teshima ................. | G08G 1/095 340/815.45 |
| 6,850,080 B2 | * | 2/2005 | Hiroki .................... | G09G 3/006 324/754.27 |
| 6,891,391 B2 | * | 5/2005 | Hiroki .................... | G01R 31/01 324/762.09 |
| 6,987,400 B2 | * | 1/2006 | Toro-Lira ............... | G09G 3/006 324/501 |

(Continued)

FOREIGN PATENT DOCUMENTS

KR 10-2008-0009996 1/2008
KR 10-1039049 5/2011

(Continued)

*Primary Examiner* — Jermele M Hollington
*Assistant Examiner* — Christopher McAndrew
(74) *Attorney, Agent, or Firm* — F. Chau & Associates, LLC

(57) ABSTRACT

A device for inspecting an organic light-emitting display apparatus includes a power supply unit, a power receiving unit, a wiring location sensing unit, and a control unit. The power supply unit applies an AC signal to each of wirings arranged in the organic light-emitting display apparatus. The power receiving unit senses an electrical signal from each of the wirings. The wiring location sensing unit senses a location of each of the wirings. The control unit determines whether each of the wirings has a defect based on the sensed electrical signal and information pertaining to each wiring type of the wirings.

13 Claims, 5 Drawing Sheets

(56) References Cited

U.S. PATENT DOCUMENTS

| | | | | |
|---|---|---|---|---|
| 7,106,089 B2* | 9/2006 | Nakano | | G09G 3/006 324/762.09 |
| 7,295,030 B2* | 11/2007 | Imura | | G09G 3/006 324/762.09 |
| 7,317,326 B2* | 1/2008 | Nakano | | G09G 3/006 324/762.09 |
| 7,532,018 B2* | 5/2009 | Hiroki | | G09G 3/006 324/754.29 |
| 7,554,822 B2* | 6/2009 | Waffenschmidt | | H02M 3/337 361/709 |
| 7,679,381 B2* | 3/2010 | Ma | | G01N 21/6489 324/754.07 |
| 7,902,845 B2* | 3/2011 | Hiroki | | G09G 3/006 324/750.15 |
| 2004/0246019 A1* | 12/2004 | Nakano | | G09G 3/006 324/762.09 |
| 2007/0170933 A1* | 7/2007 | Ma | | G01N 21/6489 324/754.03 |
| 2009/0212792 A1* | 8/2009 | Hiroki | | G09G 3/006 324/762.01 |
| 2010/0244255 A1* | 9/2010 | Lee | | H01L 21/7682 257/751 |
| 2012/0217915 A1* | 8/2012 | Wu | | H02P 21/16 318/400.07 |
| 2012/0217923 A1* | 8/2012 | Wu | | H02P 21/0003 318/610 |
| 2013/0285996 A1 | 10/2013 | Lee et al. | | |
| 2013/0293236 A1 | 11/2013 | Lee et al. | | |
| 2013/0307557 A1 | 11/2013 | Lee et al. | | |

FOREIGN PATENT DOCUMENTS

| | | |
|---|---|---|
| KR | 10-2012-0066418 | 6/2012 |
| KR | 10-2013-0120315 | 11/2013 |
| KR | 10-2013-0124008 | 11/2013 |
| KR | 10-2013-0128934 | 11/2013 |

* cited by examiner

APPARATUS AND METHOD FOR INSPECTING AN ORGANIC LIGHT-EMITTING DISPLAY APPARATUS

CROSS-REFERENCE TO RELATED PATENT APPLICATIONS

This U.S. application claims priority under 35 U.S.C. §119 to Korean Patent Application No. 10-2013-0097315, filed on Aug. 16, 2013, in the Korean Intellectual Property Office, the disclosure of which is incorporated by reference herein.

TECHNICAL FIELD

Exemplary embodiments of the present invention relate to a display apparatus, and more particularly, to an apparatus and a method of inspecting an organic light-emitting display apparatus.

DISCUSSION OF THE RELATED ART

Recently, many display apparatus have been replaced with portable thin film type flat panel display apparatuses. Among the flat panel display apparatuses, an organic light-emitting display apparatus, which is a self-lighting type display apparatus, has received much attention due to its wide angle of view, excellent contrast, and quick response speed.

The organic light-emitting display apparatus includes an intermediate layer, a first electrode, and a second electrode. The intermediate layer includes an organic emission layer that emits visible light when a voltage is applied to the first and second electrodes.

There are various types of wirings used to drive the organic light-emitting display apparatus. Some of the wirings may be arranged on different layers and overlapped with each other and there is a need for repairing a short or an open defect when such defects occur on the overlapped area.

Accordingly, recognizing the defective wirings by inspecting the wirings in the organic light-emitting display apparatus may be needed.

SUMMARY

According to an embodiment of the present invention, a device for inspecting an organic light-emitting display apparatus having a plurality of wirings is provided. Each of the plurality of wirings has a particular wiring type. The device includes a power supply unit, a power receiving unit, a wiring location sensing unit, and a control unit. The power supply unit is configured to apply an alternating current (AC) signal to each of the plurality of wirings arranged in the organic light-emitting display apparatus. The power receiving unit is configured to sense an electrical signal generated by transmitting the AC signal over each of the plurality wirings. The wiring location sensing unit is configured to sense a location of a wiring under inspection the plurality of wirings. The control unit is configured to determine whether the wiring under inspection has a defect based on the sensed electrical signal, the sensed location of the wiring under inspection by the wiring location sensing unit, and information pertaining to each type of the plurality of wirings.

The control unit may use a signal sensed at a time when the sensed electrical signal has a maximum value to determine whether the wiring under inspection has a defect.

The information may include phase information of a normal electrical signal obtained according to each wiring type of the plurality of wirings. The phase information may include a time when the normal electrical signal has a maximum value. The normal electrical signal may be sensed in advance from a normal wiring corresponding to each wiring type of the plurality of wirings.

The device may further include a storage unit configured to store the information according to each wiring type of the plurality of wirings.

The information may include wiring location information obtained according to each wiring type of the plurality of wirings.

The power supply unit and the power receiving unit may be arranged to be in contact with or spaced apart from the wiring under inspection of the plurality of wirings.

The power supply unit may apply a substantially same AC signal to each of the plurality of wirings.

According to an embodiment of the present invention, a method of inspecting an organic light-emitting display apparatus having a plurality of wirings is provided. The method includes obtaining information according to each wiring type of the plurality of wirings, arranging a power supply unit and a power receiving unit to face a wiring under inspection of the plurality of wirings, determining a wiring type of the wiring under inspection based on the obtained information, applying an AC signal to the wiring under inspection, sensing an electrical signal from the wiring under inspection; and determining a defect of the wiring under inspection using the sensed electrical signal, determined wiring type of the wiring under inspection, and the obtained information pertaining to each wiring type of the plurality of wirings.

The obtaining of the information may include obtaining wiring location information according to each wiring type of the plurality of wirings and phase information of a normal electrical signal sensed in advance according to each wiring type of the plurality of wirings.

The obtaining of the wiring location information may include obtaining a relative location of a wiring from a pixel of the organic light-emitting display apparatus.

The obtaining of the wiring location information may include obtaining a location of a wiring represented in a coordinate form using a point of the organic light-emitting display apparatus as a reference point.

The obtaining of the phase information may include obtaining a delayed phase with respect to a phase of the applied AC signal.

The obtaining of the phase information may include calculating a resistance and a parasitic capacitance to each type of the plurality wirings to calculate an amount of an RC delay.

The obtaining of the phase information may include sampling the normal wiring corresponding to each wiring type of the plurality of wirings, applying the AC signal to the sampled normal wiring, sensing the normal electrical signal from the sampled at least one wiring, and analyzing the normal electrical signal.

The obtaining of the phase information may include obtaining a time when the normal electrical signal has the maximum value.

The determining of the wiring type of the wiring under inspection may include sensing a location of the wiring under inspection and comparing the sensed location of the wiring under inspection with the obtained wiring location information according to each wiring type of the plurality of wirings.

The plurality of wirings may be sequentially inspected.

The plurality of wirings of the organic light-emitting display apparatus may be arranged side by side.

According to an embodiment of the present invention, a device for inspecting an organic light-emitting display apparatus having a plurality of wirings is provided. Each of the plurality of wirings has a particular wiring type. The device includes a power supply unit, a power receiving unit, and a control unit. The power supply unit is configured to apply an alternating current (AC) signal to each of a plurality of wirings arranged in the organic light-emitting display apparatus. The power receiving unit is configured to sense an electrical signal generated by transmitting the AC signal over each of the plurality wirings. The control unit is configured to determine whether each of the plurality of wirings has a defect based on the sensed electrical signal and phase information of a normal electrical signal obtained according to each wiring type of the plurality of wirings. The normal electrical signal may be sensed in advance from a normal wiring corresponding to each wiring type of the plurality of wirings.

The phase information may include a time when the reference electrical signal sensed in advance has a maximum value.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

The configuration and effect of the present invention will be described below in detail with reference to embodiments of the present invention as shown in the accompanying drawings.

Figure 1:
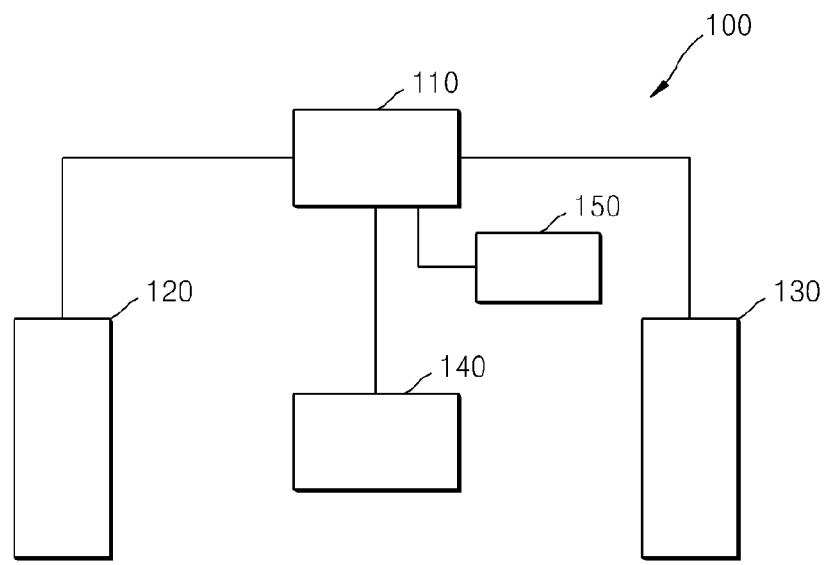
FIG. 1 is a schematic diagram of a device for inspecting an organic light-emitting display apparatus according to an embodiment of the present invention.

FIG. 1 is a schematic diagram of a device (hereafter, refer to as "inspection device") for inspecting an organic light-emitting display apparatus according to an embodiment of the present invention.

Referring to FIG. 1, an inspection device 100 for inspecting an organic light-emitting display apparatus according to an embodiment of the present invention includes a control unit 110, a power supply unit 120, a power receiving unit 130, a wiring location sensing unit 140, and a storage unit 150.

The control unit 110 performs an electrical inspection using an electrical signal to wirings in the organic light-emitting display apparatus and determines whether a wiring has a short or an open defect.

The power supply unit 120 sequentially applies an AC voltage to the wirings for the electrical inspection. To this end, the power supply unit 120 may be disposed adjacently to one end of a wiring on which the electrical inspection is performed.

The power receiving unit 130 may be arranged adjacently to the other end of the wiring. The other end of the wiring is the opposite side of one end of the wiring that faces the power supply unit 120. When the inspection device 100 is implemented as a contact type, the power supply unit 120 and the power receiving unit 130 may be connected to the one and the other ends of the wiring, respectively. When the inspection device 100 is implemented as a contact-less type, the power supply unit 120 and the power receiving unit 130 of the inspection device 100 face the one and the other ends of the wiring, but spaced apart from the same. The power receiving unit 130 senses an electrical signal generated by transmitting the AC voltage applied by the power supply unit 120 over the wiring. When the inspection device 100 is implemented as a contact type, the power supply unit 120 and the power receiving unit 130 may be connected to the one and the other ends of the wiring, respectively. When the inspection device 100 is implemented as a contact-less type, the power supply unit 120 and the power receiving unit 130 of the inspection device 100 may be disposed to face the one and the other ends of the wiring, respectively, but spaced apart from the same.

The wiring location sensing unit 140 senses information about location of the wiring. For example, when arranging the power supply unit 120 and the power receiving unit 130 to face the one and the other ends of the wiring, the wiring location sensing unit 140 senses the location information of the wiring. For example, the location information may include how far the wiring is spaced apart from the center of a pixel or where it is located with respect to a point of a substrate. The wiring location sensing unit 140 may include an optical, electrical or contact-type sensor.

The storage unit 150 stores the location information on the wiring sensed by the wiring location sensing unit 140. The storage unit 150 stores information on an electrical signal according to a type of each wiring. For example, the information on the electrical signal may include a time when the maximum value of the electrical signal that can be sensed by the power receiving unit 130 appears. The Information on the electrical signal may be obtained by a calculation or a measurement. Related details will be described below.

The control unit 110 may determine a defect on a wiring through the electrical inspection by using location information on the wiring and information on an electrical signal according to a type of a wiring. Although FIG. 1 shows the control unit 110 and the storage unit 150 separately, the present invention is not limited thereto. For example, the control unit 110 and the storage unit 150 may be formed together.

An inspection method using the inspection device 100 for inspecting the organic light-emitting display apparatus will be described in detail.

Figure 2:
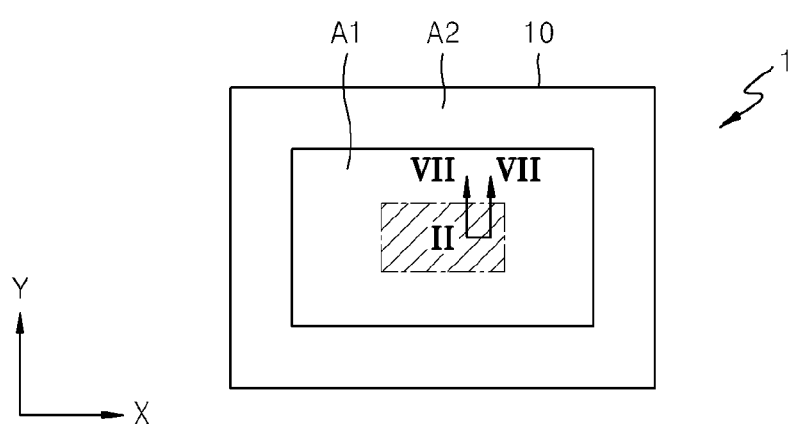
FIG. 2 is a schematic plane view of an organic light-emitting display apparatus to be measured by an inspection device of FIG. 1, according to an embodiment of the present invention.
Figure 3:
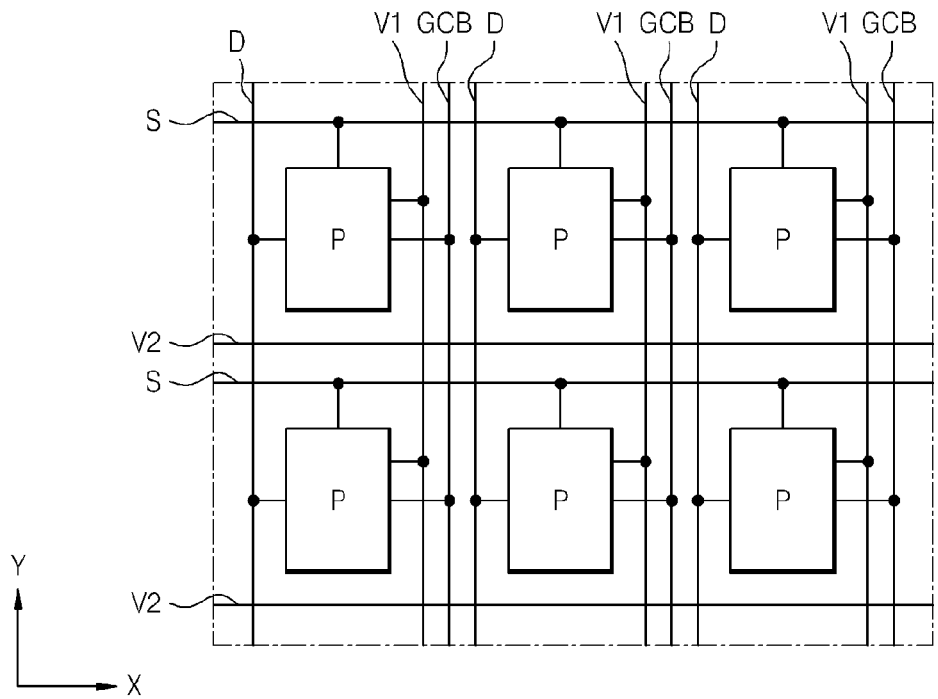
FIG. 3 is a schematic diagram of a wiring structure of area II of FIG. 2, according to an embodiment of the present invention.

FIG. 2 is a schematic plane view of an organic light-emitting display apparatus to be measured by an inspection device of FIG. 1, according to an embodiment of the present invention, and FIG. 3 is a schematic diagram of a wiring structure of area II of FIG. 2, according to an embodiment of the present invention.

Referring to FIGS. 2 and 3, the organic light-emitting display apparatus 1 includes a display area A1 and a non-display area A2 on a substrate 10.

The display area A1 is an area for displaying an image and may be formed on an area including the center of the substrate 10 and arranged around the display area A1.

The display area A1 includes a plurality of pixels on which an image is produced. Each pixel P of the plurality of pixels may be defined by a scan line S extended in a first direction X and a data line D extended in a second direction Y that is orthogonal to the first direction X. The data line applies, to each pixel P, a data signal provided by a data driving unit (not shown) to each pixel P. The scan line S applies, to each pixel P, a scan signal provided by a scan driving unit (not shown) to each pixel P. The data driving unit and the scan driving unit may be installed on the non-display area A2. Although FIG. 2 shows that the data line D is extended in the second direction and the scan line S is extended in the first direction, the present invention is not limited thereto. For example, the extended directions of the data line D and the scan line S may be swapped with each other.

Referring to FIG. 3, each pixel P is connected to a first power supply line V1 that is extended in the second direction Y. The first power supply line V1 applies a power provided by a first power driving unit (not shown) installed on the non-display area A2 to each pixel P.

On the other hand, a second power supply line V2 extended in the first direction X is connected to the first power supply line V1. The first power supply line V1 may suffer from a voltage (i.e., IR) drop due to a resistance in a path. The voltage drop depends on a length of the path having the resistance, and an effect of the voltage drop may be reduced by the second power supply line V2 connected to the first power supply line V1. However, an embodiment of present invention need not include the second power supply line V2, although the second power supply line V2 is not shown.

Each pixel P is connected to a control line GCB of a control line unit (not shown). The control line GCB applies control signals provided by a control signal driving unit (not shown) to each pixel P. The control driving unit may be installed on the non-display area A2 and the control signals may have a predefined voltage level.

Further, each pixel P includes an organic light-emitting device (not shown, but see the following description) to produce visible light.

Referring back to FIG. 2, the data line D, each of the first power supply lines V1, and the control line GCB arranged in the Y-axis direction need not be connected to the scan line S arranged in a direction that crosses them. Further, none of the data line D and the control line GCB is not connected to the second power supply line V2 arranged in a direction that crosses them.

However, a particle or other impurities may permeate a specific area of the areas where the data line D, the first power supply line V1 or the control line GCB cross the scan line S or the second power supply line V2, and as a result, a short defect may occur on the specific area.

Since the short defect decreases a picture quality of the organic light-emitting display apparatus 1, a repair process to the short defect may be performed. To perform the repair process, an electrical inspection on the data line D, the first power supply line V1, or the control line GCB may be needed. The electrical inspection may be performed by using the inspection device 100 as illustrated in FIG. 1.

A open defect may occur, for example when connections among the data line D, the first power supply line V1, and the control line are open, and accordingly, an electrical inspection and repair process to the open defect may be needed.

Figure 4:
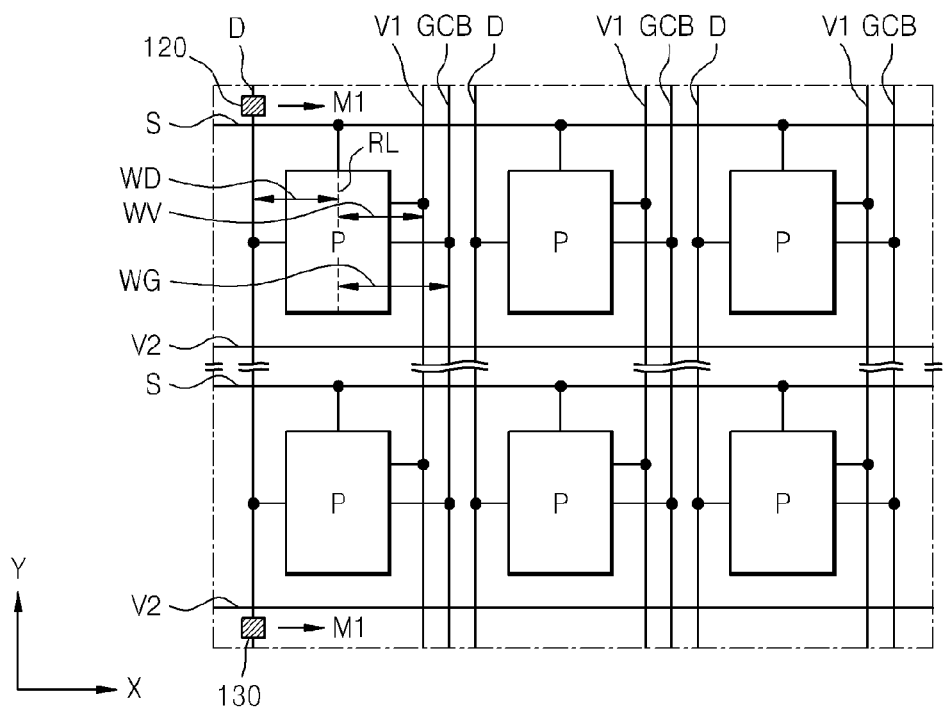
FIG. 4 is a schematic diagram illustrating one step of a method of inspecting an organic light-emitting display apparatus by using an inspection device of FIG. 1, according to an embodiment of the present invention.

FIG. 4 is a schematic diagram illustrating one step of a method of inspecting an organic light-emitting display apparatus by using an inspection device of FIG. 1, according to an embodiment of the present invention.

Referring to FIG. 4, the power supply unit 120 and the power receiving unit 130 of the inspection device 100 are provided to face a data line D. In addition, the power supply unit 120 supply a voltage to the data line D and the power receiving unit 130 senses an electrical signal generated by transmitting the voltage applied by the power supply unit 120 over the data line D. In this case, the voltage supplied by the power supply unit 120 may be an AC voltage.

The power supply unit 120 and the power receiving unit 130 may be arranged as closely as possible to the one and the other ends of the data line D, respectively. For example, the power supply unit 120 and the power receiving unit 130 may apply a voltage and sense an electrical signal through directly contacted points to the one and the other ends of the data D or without the contacted points.

Further, the power supply unit 120 and the power receiving unit 130 may move in a direction (e.g., M1 direction of FIG. 4), and accordingly, the voltage application and the signal sensing may be performed on wirings. The wirings may include a data line D and the wirings adjacent thereto such as the first power supply line V1, the control line GCB, or the like.

As described above, the organic light-emitting display apparatus 1 may be inspected through the voltage application by the power supply unit 120 and the signal sensing by the power receiving unit 130. For example, the inspection on the organic light-emitting display apparatus 1 may include the electrical inspections on the data line D and the wirings adjacent thereto such as the first power supply line V1, the control line GCB, or the like. When the power receiving unit 130 senses an electrical signal transmitted over a data line D having a short or an open defect, the sensed electrical signal may be different from a sensed electrical signal transmitted over a normal data line D having neither short nor open defect. Accordingly, it may be easy to determine whether a data line D is normal or defective.

Whether the first power supply line V1 and the control line GCB are defective may be determined in the similar way.

On the other hand, although the same electrical signal is applied to the wirings by the power supply unit 120, the electrical signals sensed by the power receiving unit 130 may be different from each other. For example, when an AC voltage is applied to the wirings by the power supply unit 120, the power receiving unit 130 senses electrical signals that have phase differences that depend on types of the wirings.

For example, the phase differences may result from different materials, widths, and thicknesses of the wirings, and thus, resistances over the wirings may be different. The phase differences may also result from different parasitic capacitances of the wrings that come from an adjacent insulating layer and an adjacent conductive layer. For example, the phase differences may result from differences in RC delays that depend on the types of the wirings.

In addition, when a phase difference in a sensed electrical signal on the wiring arises, an accuracy of the inspection using the same AC voltage to all the wirings under section may be reduced accordingly.

A related description will be made in detail with reference to FIG. 5.

Figure 5:
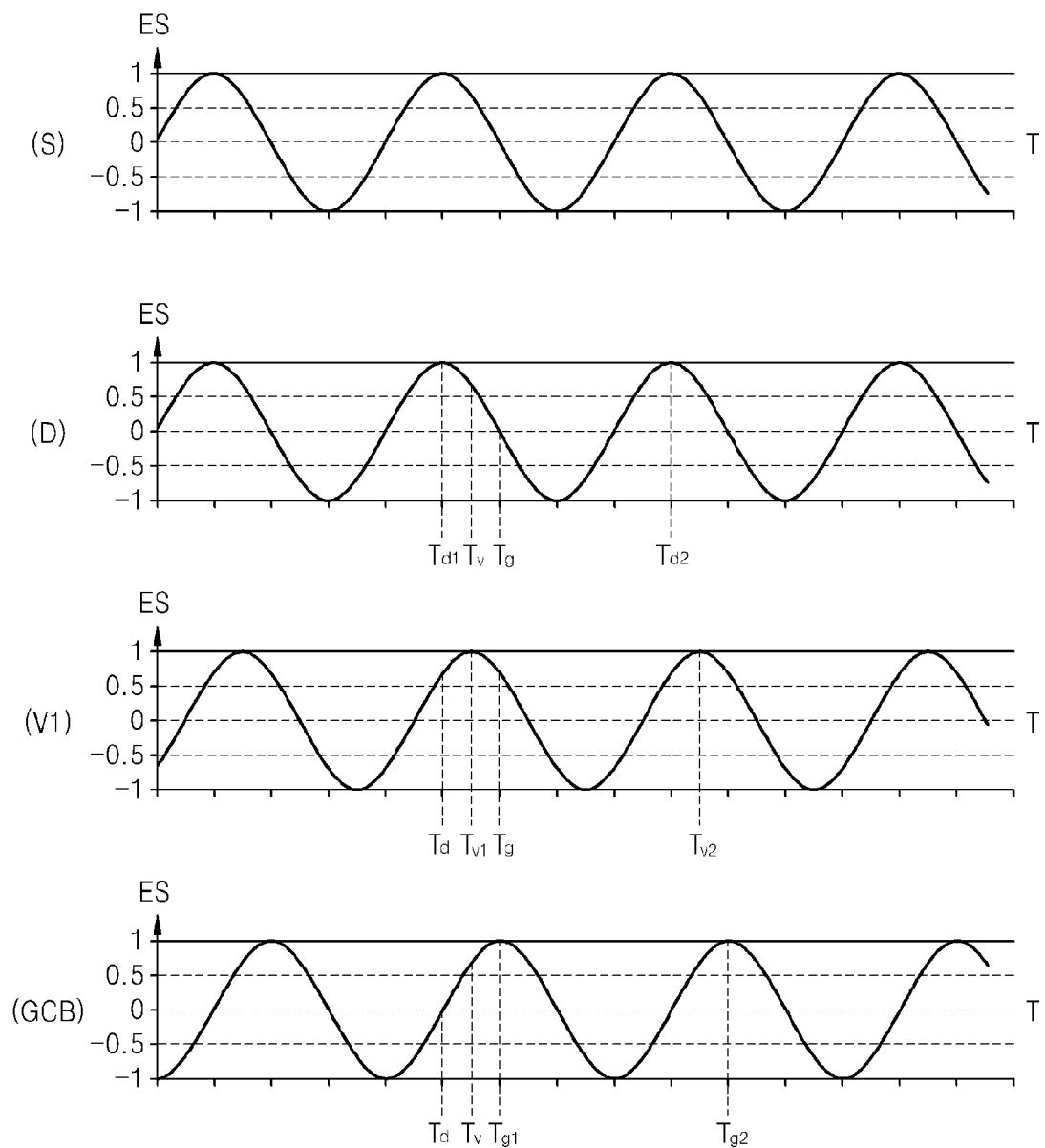
FIG. 5 is a timing diagram of an electrical signal used in the inspection method of FIG. 4, according to an embodiment of the present invention.

FIG. 5 is a timing diagram of an electrical signal used in the inspection method of FIG. 4, according to an embodiment of the present invention.

The graph (S) of FIG. 5 represents a waveform of an AC voltage that is an electrical signal applied commonly to the wirings by the power supply unit 120 of the inspection device 100 for inspecting the organic light-emitting display apparatus of FIG. 1. The wirings may include the data line D, the first power supply line V1, and the control line GCB.

However, the wirings of the present invention are not limited to the data line D, the first power supply line V1, and the control line GCB. For example, the wirings may be various types of wirings that correspond to a pixel P.

In FIG. 5, X axis and Y axis represent a time T and an amplitude of an electrical signal ES, respectively.

The graph (D) of FIG. 5 represents an electrical signal sensed by the power receiving unit 130 when a signal such as the graph (S) of FIG. 5 is applied to the data line D through the power supply unit 120.

The graph (V1) of FIG. 5 represents an electrical signal sensed through the power receiving unit 130 when the signal such as the graph (S) of FIG. 5 is applied to the first power supply line V1 through the power supply unit 120. The electrical signal of the graph (V1) of FIG. 5 has a phase different from that of the graph (D) of FIG. 5. For example, the phase of the graph (V1) of FIG. 5 is delayed by a certain value as compared to the phase of the graph (D) of FIG. 5.

The graph (GCB) of FIG. 5 represents an electrical signal sensed through the power receiving unit 130 when the signal such as the graph (S) of FIG. 5 is applied to the control line GBG through the power supply unit 120. The electrical signal of the graph (GCB) of FIG. 5 has a phase different from that of the graph (V1) of FIG. 5. For example, the phase of the graph (GCB) of FIG. 5 is delayed by a certain value as compared to the phase of the graph (V1) of FIG. 5.

The delays (e.g., phase differences) among the sensed electrical signal may result from the differences in the RC delays generated by the different resistances and parasitic capacitances of the data line D, the first power supply line V1, and the control line GCB as described above.

As a result, due to the differences in the RC delays, the sensed electrical signals of the graphs (D), (V1), and (GCB) of FIG. 5 may have different phases as compared to the electrical signal of the graph (S) of FIG. 5. For example, the RC delays of the data line D, the first power supply line V1, and the control line GCB may be different from each other.

The waveforms of the electrical signals shown in FIG. 5 are only examples, and the phase differences of the sensed electrical signals of the graphs (D), (V1), and (GCB) of FIG. 5 may vary as described above.

The inspection device 100 for inspecting the organic light-emitting display apparatus illustrated in FIG. 1 may determine a defect of a wiring through the electrical inspection using the electrical signal sensed by the power receiving unit 130 as shown in FIG. 5. In particular, the control unit 110 perform the electrical inspections to the data line D, the first power supply line V1, and the control line GCB and determine defects thereof.

The control unit 110 may perform the inspection by obtaining an amplitude at a specific time of an electrical signal sensed by the power receiving unit 130. To increase the inspection efficiency, the specific time of the electrical signal may be chosen to have a maximum value. For example, when a wiring is the data line D, the amplitude of the electrical signal has a maximum value at a time Td1 or Td2 as shown in the graph (D) of FIG. 5. Accordingly, the control unit 100 may perform the inspection on the data line D by obtaining a value of the electrical signal at the time of Td1 or Td2. When an electrical signal is inspected at the time Td1 or Td2, a difference between a normal data line D and a defective data line D may be clearly identified. This is because an electrical signal sensed from the normal data line D has a maximum value at the time of Td1 or Td2, but an electrical signal sensed from the defective data line D may have a considerably low amplitude at the time of Td1 or Td2. To this end, the control unit 110 may obtain information on the electrical signal of the data line D in advance. For example, the information may include when the time of Td1 or Td2 is. Further, repetitive inspections on the data lines D using the obtained information may be performed.

Referring back to the graphs (V1) and (GCB) of FIG. 5, each of the electrical signals of the first power supply line V1 and the control line GCB might not have the maximum amplitude at the time of Td1 nor Td2. For example, referring to the graph (V1) of FIG. 5, an amplitude of the electrical signal at the time of Td1 is slightly greater than half of the maximum value, and referring to the graph (GCB) of FIG. 5, an amplitude of the electrical signal at the time of Td1 is close to zero.

Therefore, there may be a limit in performing electrical inspections on the other wirings except the data line D1 using the information on the time of Td1 or Td2 which corresponds to a maximum amplitude when a wiring is the data line D.

Therefore, the inspection device 100 may obtain the information on the electrical signal of each of the graphs (D), (V1) and (GCB) of FIG. 5 in advance.

For example, when a wiring is the first power supply line V1, the electrical signal may have a maximum value at a time of Tv1 or Tv2 as shown in the graph (V1) of FIG. 5. Accordingly, the control unit 110 may perform the electrical inspection on the first power supply line V1 by obtaining an amplitude of the electrical signal at the time of Tv1 or Tv2. As described above, the control unit 110 may obtain the information on the electrical signal of the first power supply line V1 in advance. For example, the information may include when the time of Tv1 or Tv2 is. Further, repetitive inspections on the first power supply line V1 using the obtained information may be performed.

For example, when a wiring is the control line GCB, the electrical signal may have a maximum value at a time of Tg1 or Tg2 as shown in the graph (GCB) of FIG. 5. Accordingly, the control unit 110 may perform the electrical inspection on the control line GCB by obtaining an amplitude of the electrical signal at the time of Tg1 or Tg2. As described above, the control unit 110 may obtain the information on the electrical signal of the control line GCB in advance. For example, the information may include when the time Tg1 or Tg2 is. Further, repetitive inspections on the control line GCB using the obtained information may be performed.

As described above, since the electrical signals of the graphs (D), (V1), and (GCB) of FIG. 5, namely have difference phases, information on a time (hereafter, referred to as 'phase information') when each of the electrical signals reaches a maximum value may be different. The phase information may be obtained using a calculation or a measurement. A related description will be made in detail.

For example, a method using the calculation is described. The electrical phase differences of the graphs (D), (V1) and (GCB) of FIG. 5 may be due to differences in RC delays as described above. Therefore, when an RC delay is calculated in advance according to a type of a wiring, an amount of phase differences of the graphs (D), (V1) and (GCB) of FIG. 5 with respect to the phase of the graph (S) of FIG. 5 may be obtained. Thus, phase information on an electrical signal may be obtained.

To calculate the RC delay, a resistance and a parasitic capacitance are calculated. The resistance is calculated by using a width, a thickness, and a resistivity of each of the data line D, the first power supply line V1, and the control line GCB. In addition, the parasitic capacitance may be calculated by using a thickness and a permittivity of an insulating layer and an area overlapped with a conduction layer. Here, the insulating and conducting layer may be adjacent to each of the data line D, the first power supply line V1, and the control line GCB.

As described above, the RC delay may be calculated by using the resistance and parasitic capacitance of the data line D, the first power supply line V1, and the control line GCB, and accordingly, an amount of phase differences of the graphs (D), (V1), and (GCB) of FIG. 5 with respect to the phase of the graph (S) of FIG. 5 may be obtained. Thus, the phase information on an electrical signal may be obtained.

For example, a method using the measurement is described. Each of the data lines D, the first power supply line V1, and the control line GCB is sampled and then an actual electrical signal transmitted over them is analyzed. For example, at least one data line D are selected and checked, an AC voltage is applied by the power supply unit 120, an electrical signal transmitted over the selected at least one data line D is sensed by the power receiving unit 130, and a waveform of the sensed electrical signal is analyzed. The analysis of the sensed electrical signal may be performed using an external separate device or the control unit 110. However, the present inventive concept is not limited thereto.

As described above, an electrical signal of a normal data line D may be obtained by analyzing the electrical signal of the sampled data line D. The electrical signal of the normal data line D may include information used as a standard for comparison with a data line. For example, phase information including a time Td1 or Td2 when the electrical signal of the graph (D) of FIG. 5 has a maximum value may be obtained.

An electrical signal of the first power supply line V1 to be used a standard for comparison is also obtained using the similar method. For example, information on a time point Tv1 or Tv2 when the electrical signal of the graph (V1) of FIG. 5 reaches a maximum value.

Further, an electrical signal of the control line GCB to be used a standard for comparison is also obtained using the similar method. For example, information on a time point Tg1 or Tg2 when the electrical signal of the graph (GCB) of FIG. 5 reaches a maximum value.

On the other hand, location information on each of the wirings may be obtained before actual electrical inspection is performed, in addition to the information on the electrical signals of the graph (D), (V1), and (GCB) of FIG. 5 using the calculation method or the measurement method as previously described.

Hereafter, a procedure to obtain the location information on the wirings will be described in detail. The location information obtained in advance may make it easier to determine a type of a wiring. For example, the wiring location information obtained in advance may make it possible to determine which type of wiring among the data line D, the first power supply line V1 and the control line GCB a wiring correspond to, by checking the location of the wiring when the electrical inspection is performed.

A detailed description will be made with reference to FIG. 4. A data line D is spaced apart by a distance WD to the left from a reference line RL of a pixel P, a first power supply line V1 is spaced apart by a distance WV to the right from the reference line RL of the pixel P, and a control line GCB is spaced apart by a distance WG to the right from the reference line RL of the pixel. For example, location information on each of the data line D, the first power supply line V1, and the control line GCB is indicated and obtained by a distance and a direction from a pixel P, and stored in the storage unit 150 before the inspection of each of the wirings is performed.

For example, the data line D, the first power supply line V1, and the control line GCB of FIG. 4 are regularly arranged as shown in FIG. 4. Due to the regularly arranged feature, location information of the data line D, the first power supply line V1, and the control line GCB may easily be obtained.

In this case, the reference line RL of the pixel P may be a line crossing the central point of the pixel P. However, the present invention is not limited thereto. For example, a certain point or a certain line on each pixel P may be defined as a reference point or a reference line.

Further, for example, a point or a line on a substrate 10 may be defined as a reference point or a reference line. Thus, the reference point or the reference line may be used as a starting point or a starting line to represent the location of each of the data line D, the first power supply line V1, and the control line GCB.

The location information may be obtained through various ways. For example, the location information may be obtained based on information on each of the wirings generated when the organic light-emitting display apparatus 1 is designed or information used during a manufacturing process of each of the wirings when the organic light-emitting display apparatus 1 is manufactured. The obtained location information may be stored in the storage unit 150 of FIG. 1.

After the phase information on the electrical signals of the data line D, the first power supply line V1, and the control line GCB and the location information on each of the wirings are obtained, an inspection may sequentially be performed to each of the data lines D, the first power supply line V1, and the control line GCB. However, an order such that the inspection is performed is not limited thereto.

For example, the data line D, the first power supply line V1, and the control line GCB may sequentially be inspected along a M1 direction of FIG. 4. An example of an inspection method will be described in detail.

Referring back to FIG. 1 and FIG. 4, the power supply unit 120 and the power receiving unit 130 are arranged to face the one and the other end of a first wiring, for example, the data line D. In this case, the inspection device 100 might not immediately recognize whether the first wiring is the data line D. Hereafter, a process of recognizing the first wiring will be described in detail.

Firstly, the wiring location sensing unit 140 of the device 100 senses the first wiring and obtains its location. For example, the wiring location sensing unit 140 may be arranged to face the one end of the first wiring and check a distance between the first wiring and a pixel P. The control unit 110 compares and analyzes the obtained location information on the first wiring with the location information on each of the wirings stored in the above-described storage unit 150, and determines that the first wiring is the data line D. To this end, the wiring location sensing unit 140 may include various types of sensors.

The control unit 110 prepares to use phase information on an electrical signal for the data line D. As described above, the phase information may include a time when the electrical signal has a maximum value and stored in the storage unit 150.

An AC voltage is applied to the first wiring (e.g., data line D) by using the power supply unit 120 and an electrical signal transmitted over the first wiring is sensed through the power receiving unit 130. The control unit 110 uses the phase information that is prepared in advance. For example, the control unit 110 uses the phase information including a time when the electrical signal sensed by the power receiving unit 130 reaches a maximum value. Here, the phase information may be obtained by applying an AC voltage through the power supply unit 120 to the data line D. For example, the control unit 110 may automatically analyze a signal at a time when the electrical signal represents the maximum value, without a need to entirely analyze the sensed electrical signal. There may be a difference in time between when the electrical signal theoretically represents the maximum value and when the electrical signal actually represents the maximum value. However, this difference may be reduced by obtaining the phase information on the electrical signal based on the measurement or by increasing the number of sampling times to obtain the phase information.

Therefore, the electrical inspection of the data line D may easily be performed without a complex process and a defect may be determined through the inspection.

After the inspection on the first wiring is performed, the power supply unit 120 and the power receiving unit 130 may be arranged to face a second wiring, for example, the first power supply line V1. In this case, the inspection device 100 might not immediately recognize whether the second wiring is the first power supply line V1. Hereafter, a process of recognizing the second wiring will be described in detail.

Firstly, the wiring location sensing unit 140 of the device 100 senses the second wiring and obtains its location. For example, the wiring location sensing unit 140 may be arranged to face the one end of the second wiring and check a distance between the second wiring and a pixel P. The control unit 110 compares and analyzes the obtained information on the second wiring with the location information on each of the wirings stored in the above-described storage unit 150, and determines that the second wiring is the first power supply line V1.

The control unit 110 prepares to use phase information on an electrical signal for the first power supply line V1. As described above, the phase information may include a time when the electrical signal has a maximum value and the phase information may be stored in the storage unit 150.

An AC voltage is applied to the second wiring (e.g., first power supply line V1) by using the power supply unit 120 and an electrical signal transmitted over the second wiring is sensed through the power receiving unit 130. The control unit 110 uses the phase information that is prepared in advance. For example, the control unit 110 analyzes the electrical signal to determine when the electrical signal sensed by the power receiving unit 130 reaches the maximum value. Here, the phase information may be obtained by applying an AC voltage through the power supply unit 120 to the first power supply line V1. Thus, the electrical inspection of the first power supply line V1 may easily be performed without a complex process and a defect may be determined through the inspection.

After the Inspection on the second wiring is performed, the power supply unit 120 and the power receiving unit 130 may be arranged to face a third wiring, for example, the control line GCB. In this case, the inspection device 100 might not immediately recognize whether the third wiring is the first power supply line V1. Hereafter, a process of recognizing the second wiring will be described in detail.

Firstly, the wiring location sensing unit 140 of the device 100 senses the third wiring and obtains its location. For example, the wiring location sensing unit 140 may be arranged to face the one end of the third wiring and check a distance between the third wiring and a pixel P through the wiring location sensing unit 140. The control unit 110 compares and analyzes the obtained information on the third wiring with the location information on each of the wirings stored in the above-described storage unit 150, and determines that the third wiring is the control line GCB.

The control unit 110 prepares to use phase information on an electrical signal for the control line GCB. As described above, the phase information may include a time when the electrical signal has a maximum value and the phase information may be stored in the storage unit 150. An AC voltage is applied to the third wiring (e.g., control line GCB) by using the power supply unit 120 and an electrical signal transmitted over the third wiring is sensed through the power receiving unit 130. The control unit 110 uses the phase information that is prepared in advance. For example, the control unit 110 analyzes the electrical signal to determine when the electrical signal sensed by the power receiving unit 130 reaches the maximum value. Here, the phase information may be obtained by applying an AC voltage through the power supply unit 120 to the control line GCB. Thus, the electrical inspection of the control line GCB may easily be performed without a complex process and a defect may be determined through the inspection.

Similarly, electrical inspections may sequentially be performed on the other wirings.

Figure 6:
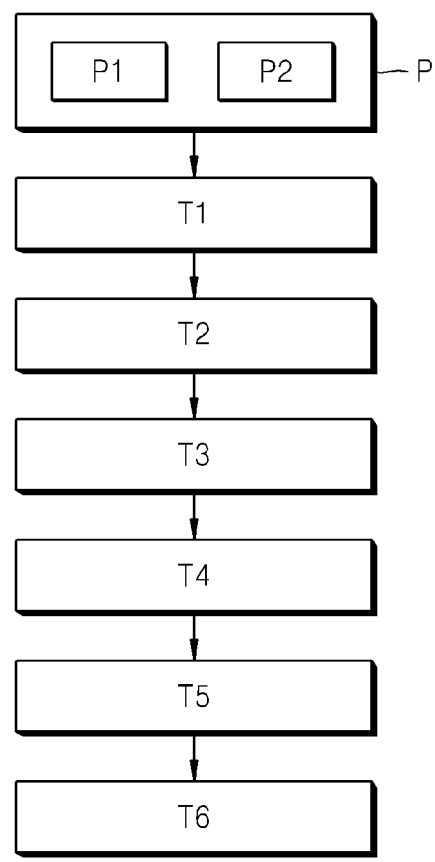
FIG. 6 is a flow chart illustrating a method of inspecting an organic light-emitting display apparatus according to an embodiment of the present invention.

FIG. 6 is a flow chart illustrating a method of inspecting an organic light-emitting display apparatus according to an embodiment of the present invention.

The above-described electrical inspection method for the wirings is an example of FIG. 6.

Referring to FIG. 6, a preliminary step P is first performed. The preliminary step P may include: obtaining location information on each of wirings P1; and obtaining time information on an electrical signal according to a type of a wiring P2.

The step of obtaining the location information on each of the wirings P1 may make it easier to determine a type of a wiring only by grasping a location of the wiring when an arbitrary wiring is inspected in the following steps. The step of obtaining the location information on each of the wirings P1 may include recognizing a distance and a direction of each type of the wiring from the reference line RL of the pixel P as illustrated in FIG. 4. For example, a point or a line on the substrate 10 may be defined as a starting point as described above and each of the wirings may be represented in a coordinates form. However, the present invention is not limited thereto and the location information on each of the wirings may be obtained through various ways.

The step of obtaining the phase information on the electrical signal according to the type of the wiring P2 may correspond to obtaining location information on an electrical signal sensed for a normal wiring when the same AC voltage is applied to each of the wirings through the power supply unit 120. The electrical signal sensed for the normal wiring may be an inspection reference. In this case, the sensed electrical signal may be different depending on a type of a wiring as previously described. This discrepancy may result from an RC delay which is a resistance in a path of each of the wirings and a parasitic capacitance in an adjacent region to each of the wirings. The information on the electrical signal including the RC delay may be obtained through a calculation and a measurement. A detailed description will be omitted since it is described above.

The information obtained from the steps P1 and P2 of the preliminary step P is stored in the storage unit 150. The storage unit 150 may be arranged separately from the control unit 110 as shown in FIG. 1 or formed together with the control unit 110.

After performing the preliminary step P, an electrical inspection is performed on each of the wirings. The power supply unit 120 and the power receiving unit 130 may move to a wiring to be inspected in step T1. For example, they may move to face a first one of wirings that are arranged in the Y axis direction of the organic light-emitting display apparatus 1.

A location of a wiring (e.g., the first wiring) that faces the power supply unit 120 and the power receiving unit 130 is sensed. For example, the wiring location sensing unit 140 grasps the location of the first wiring. For example, the wiring location sensing unit 140 may obtain information including a distance and a direction from the reference line of the pixel P.

The control unit 110 determine a type of the first wiring using the location information on the first wiring and the information stored in the storage unit 150 (e.g., information stored in step P1). For example, the control unit 110 checks which type of wiring among the data line D, the first power supply line V1, and the control line GCB the first wiring correspond to.

In step T3, the control unit 110 prepares to use phase information on an electrical signal that corresponds to the determined type of wiring. For example, the control unit 110 prepares to use information on a specific time when a sensed electrical signal reaches a maximum value when the power receiving unit 130 senses the electrical signal. This will be described below.

In addition, the control unit 110 applies an electrical signal (e.g., AC voltage) to the first wiring by using the power supply unit 120 in step T4.

In addition, the control unit 110 senses an electrical signal transmitted over the first wiring by using the power receiving unit 130 in step T5.

The control unit 110 determines whether the first wiring has a defect in step T6. For example, the signal sensed through the power receiving unit 130 may be analyzed, and an amplitude of the electrical signal at the specific time point determined in step T3 when the electrical signal reaches a maximum value may be determined.

A structure of a pixel in the organic light-emitting display apparatus 1 illustrated in FIG. 1 will be described with reference to FIGS. 7 and 8.

Figure 7:
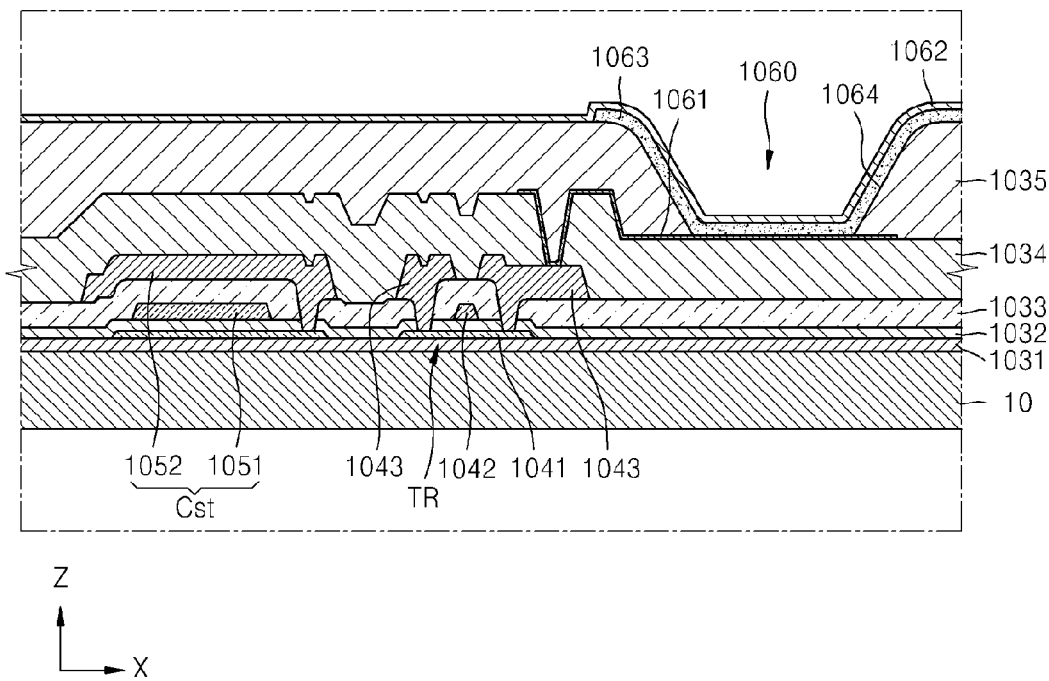
FIG. 7 is a cross-sectional view taken along line VII-VII of FIG. 2, according to an embodiment of the present invention.

FIG. 7 is a cross-sectional view taken along line VII-VII of FIG. 1.

Referring to FIG. 7, a pixel P of the organic light-emitting display apparatus 1 includes a thin film transistor TR, a capacitor Cst, and an organic light-emitting device 1060 formed together on the substrate 10.

The thin film transistor TR includes an active layer 1041, a gate electrode 1042, and source/drain electrodes 1043, the capacitor Cst includes a first capacitor electrode 1051 and a second capacitor electrode 1052, and the organic light-emitting device 1060 includes a first electrode 1061, a second electrode 1062, and an intermediate layer 1063.

A more detailed structure of the pixel P will be described later.

A buffer layer 1031 may be further formed on the substrate 10. The buffer layer 1031 provides a flat surface to the upper part of the substrate 10 and prevents moisture and foreign materials from permeating.

The active layer 1041 formed in a certain pattern is arranged on the buffer layer 1031. The first capacitor electrode 1051 is formed on the same layer as the active layer 1041 and formed of the same material as the active layer 1041.

A gate insulating layer 1032 is formed on the active layer 1041. The gate electrode 1042 is formed on the gate insulating layer 1032 to face the active layer 1041. The gate electrode 1042 is connected to the scan line S. An interlayer insulating layer 1033 is formed to cover the gate electrode 1042, and the source/drain electrodes 1043 is formed on the interlayer insulating layer 1033 to be in contact with a certain area of the active layer 1041. Any one of the source/drain electrodes 1043 is electrically connected to the data line D. The second capacitor electrode 1052 is formed on the same layer as the source/drain electrodes 1043 and formed of the same material as the source/drain electrodes 1043. A passivation layer 1034 may be formed to cover the source/drain electrodes 1043 and a separate insulating layer may be further formed on the passivation layer 1034 for the flatness of the thin film transistor TR.

The first electrode 1061 is formed on the passivation layer 1034. The first electrode 1061 is formed to be electrically connected to any one of the source/drain electrodes 1043. In addition, a pixel definition layer 1035 is formed to cover the first electrode 1061. After forming a certain opening 1064 in the pixel definition layer 1035, the intermediate layer 1063 including an organic light-emitting layer is formed in an area defined by the opening 1064. The second electrode 1062 is formed on the intermediate layer 1063.

Figure 8:
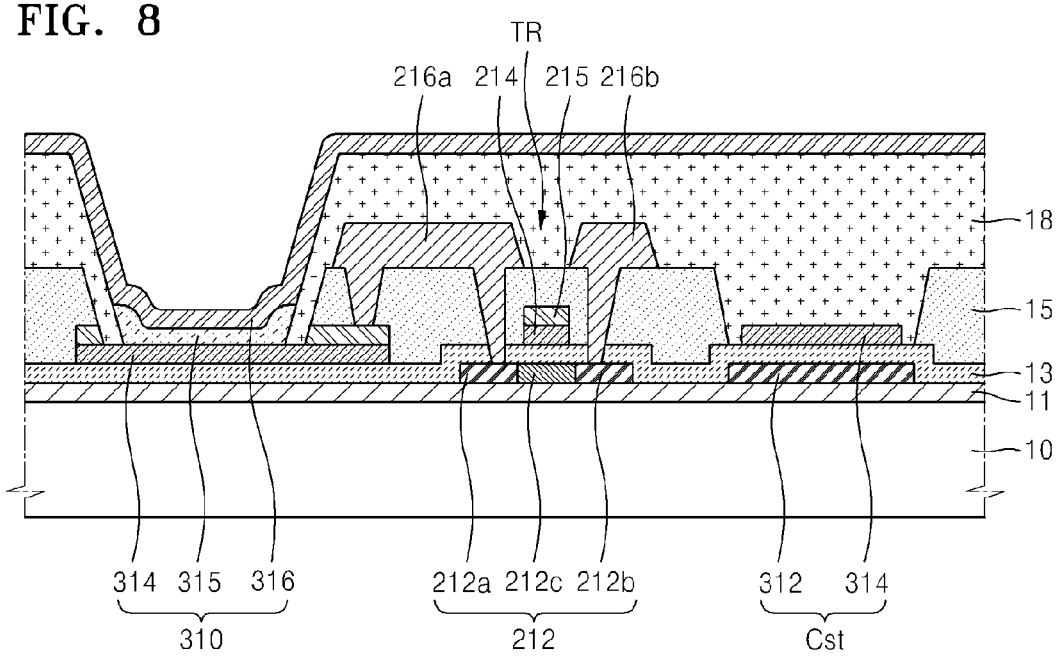
FIG. 8 is a cross-section view taken along line VII-VII of FIG. 2, according to an embodiment of the present invention.

FIG. 8 shows a structure varying from FIG. 7.

Referring to FIG. 8, a pixel P of the organic light-emitting display apparatus 1 includes a thin film transistor TR, a capacitor Cst, and an organic light-emitting device 310 formed together on the substrate 10.

A buffer layer 11 is formed on the substrate 10 and an active layer 212 of the thin film transistor TR is formed on the buffer layer 11. The active layer 212 may include a source area 212b, a drain area 212a, and a channel area 212c.

A gate insulating layer 13 is formed on the active layer 212. A gate electrode first layer 214 and a gate electrode second layer 215 are sequentially formed on the gate insulating layer 13 to face a channel area 212c of the active layer 212.

An interlayer insulating layer 15 is formed on the gate electrode second layer 215. A source electrode 216b and a drain electrode 216a are formed on the interlayer insulating layer 15 to be connected to source area 212b and the drain area 212a of the active layer 212, respectively.

On the other hand, a first electrode 314 formed of the same transparent conductive material as the gate electrode first layer 214 is formed on the gate insulating layer 13. An intermediate layer 315 including an organic light-emitting layer may be formed on the first electrode 314.

A second electrode 316 is formed as a common electrode on the intermediate layer 315.

Moreover, a first capacitor electrode 312 of the capacitor Cst and a second capacitor electrode 314 are formed on the substrate 10 and the buffer layer 11, and the gate insulating layer 13 is arranged between the first capacitor electrode 312 and the second capacitor electrode 314. The first capacitor electrode 312 may be formed of the same material as the active layer 212 of the thin film transistor TR and the second capacitor electrode 314 may be formed of the same material as the first electrode 314.

A pixel definition layer 18 is formed on the interlayer insulating layer 15 to cover the source electrode 216b and the drain electrode 216a.

In this case, the data line D of FIG. 3 as described above may be formed on the same layer as the source electrode 216b or the drain electrode 216a by using the same material as the source electrode 216b or the drain electrode 216a. Like the data line D, the control line GCB may be formed on the same layer as the source electrode 216b or the drain electrode 216a by using the same material as the source electrode 216b or the drain electrode 216a. Like the data line D, the first power supply line V1 may also be formed on the same layer as the source electrode 216b or the drain electrode 216a by using the same material as the source electrode 216b or the drain electrode 216a.

Further, the scan line S of FIG. 3 may be formed on the same layer as the gate electrode first layer 214 or the gate electrode second layer 215 by using the same material as the gate electrode first layer 214 or the gate electrode second layer 215. Like the scan line S, the second power supply line V2 may be formed on the same layer as the gate electrode first layer 214 or the gate electrode second layer 215 by using the same material as the gate electrode first layer 214 or the gate electrode second layer 215.

A sealing member (not shown) may be arranged on the second electrodes 1062 and 316 to face one surface of the substrate 10. The sealing member (not shown) is formed to protect the organic light-emitting device 1060 and 310 from external moisture or oxygen. The sealing member (not shown) may be formed of glass or plastic, or may have a structure in which an organic material and an inorganic material are overlapped.

The inspection device 100 for inspecting the organic light-emitting display apparatus according to an embodiment of the present invention may easily perform an electrical inspection on each of the wirings which have different types from each other installed in the organic light-emitting display apparatus 1.

For example, in the preliminary step P, the location information on each of the wirings and the phase information on different electrical signals may be obtained and stored. In an actual inspection step, a location of a wiring to be inspected is sensed by using the wiring location sensing unit 140 to determine a type of the wiring. Thus, the location information may make it easier to inspect a plurality of wirings sequentially by using information on an electrical signal corresponding to a type of each of the plurality of wirings. In particular, since a common AC voltage signal is applied to all types of wirings, an efficiency of the electrical inspection may be increased.

While the present invention has been particularly shown and described with reference to exemplary embodiments thereof, it will be understood that various changes in form and details may be made therein without departing from the spirit and scope of the present invention. Therefore, it may be understood that the foregoing is illustrative of the present invention and should not to be construed as being limited to the specific embodiments disclosed herein.

What is claimed is:

1. A device for inspecting an organic light-emitting display apparatus comprising:
    a power supply unit configured to apply an alternating current (AC) signal to wiring arranged in the organic light-emitting display apparatus;
    a power receiving unit configured to sense an electrical signal generated by transmitting the AC signal over the wiring;
    a wiring location sensing unit configured to sense a location of the wiring; and
    a control unit configured to:
        identify a type of the wiring based on the sensed location of the wiring;
        look up phase information for the wiring based on the identified type of the wiring; and
        determine whether the wiring has a defect based on the sensed electrical signal and the looked-up phase information for the wiring.

2. The device of claim 1, wherein the control unit determines a time when the sensed electrical signal is expected to have a maximum value based on the looked-up phase information for the wiring and then examines the sensed electrical signal at the determined time of the expected maximum value to determine whether the wiring has a defect.

3. The device of claim 1, further comprising a storage unit configured to store:
    a correspondence between a plurality of wiring types and wiring locations; and
    a correspondence between the plurality of wiring types and phase information for the plurality of wiring types.

4. The device of claim 1, wherein the power supply unit and the power receiving unit are arranged to be in contact with or spaced apart from the wiring.

5. A method of inspecting an organic light-emitting display apparatus, the method comprising:
    obtaining information pertaining to each wiring type of a plurality of wirings;
    arranging a power supply unit and a power receiving unit to face a wiring of the organic light-emitting display;
    determining a wiring type of the wiring of the organic light-emitting display based on the obtained information and determining phase information for the wiring of the organic light-emitting display based on the determined wiring type;
    applying an AC signal to the wiring of the organic light-emitting display;
    sensing an electrical signal from the wiring of the organic light-emitting display; and
    determining whether the wiring of the organic light-emitting display has a defect using the sensed electrical signal, the determined wiring type of the wiring of the organic light-emitting display, and the determined phase information.

6. The method of claim 5, wherein the obtained formation pertaining to each wiring type comprises a relative location of a wiring from a pixel of the organic light-emitting display apparatus.

7. The method of claim 5, wherein the obtained information pertaining to each wiring type comprises a location of a wiring represented in a coordinate form using a point of the organic light-emitting display apparatus as a reference point.

8. The method of claim 5, wherein the determining of the phase information comprises obtaining a delayed phase with respect to a phase of the applied AC signal.

9. The method of claim 5, wherein the determining of the phase information comprises calculating a resistance and a parasitic capacitance for each wiring type of the plurality of wirings to calculate an amount of an RC delay time.

10. The method of claim 5, wherein the determining of the phase information comprises sampling the normal wiring corresponding to each wiring type of the plurality of wirings, applying the AC signal to the sampled normal wiring, sensing the normal electrical signal from the sampled normal wiring, and analyzing the normal electrical signal.

11. The method of claim 5, wherein the determining of the phase information comprises obtaining a time when the normal electrical signal has the maximum value.

12. A device for inspecting an organic light-emitting display apparatus comprising:
a power supply unit configured to apply an alternating current (AC) signal to wiring arranged in the organic light-emitting display apparatus;
a power receiving unit configured to sense an electrical signal generated by transmitting the AC signal over the wiring; and
a control unit configured to:
identify a type of the wiring based on the sensed location of the wiring;
look up phase information of a normal electrical signal for the wiring bases on the identified type of the wiring; and
determine whether the wiring has a defect based on the sensed electrical signal and the looed-up phase information of the normal electrical signal,
wherein the normal electrical signal is sensed in advance from a known-normal wiring corresponding to the of the organic light-emitting display apparatus.

13. The device of claim 12, wherein the phase information includes a time when the normal electrical signal has a maximum value.

* * * * *